US011942568B2

(12) United States Patent
Zhang et al.

(10) Patent No.: US 11,942,568 B2
(45) Date of Patent: Mar. 26, 2024

(54) LIGHT-EMITTING DIODE DEVICE AND METHOD FOR MANUFACTURING THE SAME

(71) Applicant: XIAMEN SAN'AN OPTOELECTRONICS CO., LTD., Fujian Province (CN)

(72) Inventors: Dongyan Zhang, Tianjin (CN); Yuehua Jia, Tianjin (CN); Cheng Meng, Tianjin (CN); Jing Wang, Tianjin (CN); Chun-I Wu, Tianjin (CN); Duxiang Wang, Tianjin (CN)

(73) Assignee: XIAMEN SAN'AN OPTOELECTRONICS CO., LTD., Hongtang Town (CN)

( * ) Notice: Subject to any disclaimer, the term of this patent is extended or adjusted under 35 U.S.C. 154(b) by 496 days.

(21) Appl. No.: 16/901,299

(22) Filed: Jun. 15, 2020

(65) Prior Publication Data

US 2021/0043798 A1 Feb. 11, 2021

(30) Foreign Application Priority Data

Aug. 6, 2019 (CN) .......................... 201910722072.X

(51) Int. Cl.
*H01L 33/00* (2010.01)
*H01L 27/15* (2006.01)
*H01L 33/62* (2010.01)

(52) U.S. Cl.
CPC ........ *H01L 33/0095* (2013.01); *H01L 27/156* (2013.01); *H01L 33/62* (2013.01)

(58) Field of Classification Search
CPC . H01L 33/0095; H01L 27/156; H01L 33/382; H01L 33/46; H01L 2933/0016;
(Continued)

(56) References Cited

U.S. PATENT DOCUMENTS 10,305,003 B2 * 5/2019 Hwang .................. H01L 33/24
10,333,025 B1 * 6/2019 Park ....................... H01L 33/44
(Continued)

FOREIGN PATENT DOCUMENTS

| CN | 101937960 B | 8/2012 |
| CN | 108258097 A | 7/2018 |
| JP | 2012114130 A | 6/2012 |

OTHER PUBLICATIONS

Search Report for Chinese Application No. 201910722072.X (priority application), mailed by the CNIPA dated Apr. 29, 2020 (English translation included).
(Continued)

*Primary Examiner* — Ratisha Mehta
(74) *Attorney, Agent, or Firm* — Muncy, Geissler, Olds & Lowe, P.C.

(57) ABSTRACT

A light-emitting diode device includes an epitaxial structure that contains first-type and second-type semiconductor units and an active layer interposed therebetween, a light transmittable dielectric element that is disposed on the first-type semiconductor unit opposite to the active layer and is formed with a first through hole, an adhesive layer that is disposed on the dielectric element and is formed with a second through hole corresponding in position to the first through hole, and a metal contact element that is disposed on the adhesive layer. The adhesive layer has a thickness of at most one fifth of that of the dielectric element. The metal contact element extends into the first and second through holes, and electrically contacts the first-type semiconductor unit. A method for manufacturing the LED device is also disclosed.

25 Claims, 9 Drawing Sheets

(58) Field of Classification Search
CPC ..... H01L 33/387; H01L 33/44; H01L 33/405; H01L 33/0093; H01L 33/30; H01L 33/38; H01L 33/62
See application file for complete search history.

(56) References Cited

U.S. PATENT DOCUMENTS

| | | | |
|---|---|---|---|
| 2012/0193785 A1* | 8/2012 | Lin ................... | H01L 21/76229 257/737 |
| 2016/0172528 A1* | 6/2016 | Okushiba ............... | H01L 33/58 257/81 |
| 2018/0287021 A1* | 10/2018 | Chae ....................... | H01L 24/00 |
| 2019/0214373 A1* | 7/2019 | Kim ........................ | H01L 27/15 |
| 2019/0334061 A1* | 10/2019 | Yoon ....................... | H01L 33/20 |
| 2020/0295229 A1* | 9/2020 | Kim ....................... | H01L 33/382 |

OTHER PUBLICATIONS

Search Report appended to an Office Action, which was issued to Chinese counterpart application No. 202110171687.5 by the CNIPA dated May 2022, with an English translation thereof.
Search Report appended to an Office Action, which was issued to Chinese counterpart application No. 202110171687.5 by the CNIPA dated Sep. 29, 2021 with an English translation thereof.

* cited by examiner

LIGHT-EMITTING DIODE DEVICE AND METHOD FOR MANUFACTURING THE SAME

CROSS-REFERENCE TO RELATED APPLICATION

This application claims priority of Chinese Invention Patent Application No. 201910722072.X, filed on Aug. 6, 2019.

FIELD

The disclosure relates to a lighting device and a method of manufacturing the same, and more particularly to a light-emitting diode (LED) device and a method for manufacturing the same.

BACKGROUND

Referring to FIG. 1, a conventional light-emitting diode (LED) device with improved light emitting efficiency includes a substrate 101, an epitaxial structure that contains a first-type semiconductor layer 106, an active layer 107 and a second-type semiconductor layer 108 sequentially disposed on the substrate 101 in such order, a reflective layer 102 disposed between the substrate 101 and the epitaxial structure, a first electrode 109 disposed on the second-type semiconductor layer 108 opposite to the active layer 107, and a second electrode 100 disposed on the substrate 101 opposite to the reflective layer 102. The reflective layer 102 is configured to reflect light from the epitaxial structure toward a light emitting surface of the epitaxial structure opposite to the reflective layer 102, thereby enhancing the light emitting efficiency of the LED device. The reflective layer 102 is usually made of a metallic material having a high reflectance of light emitted by the epitaxial structure, such as aurum (Au) or silver (Ag) capable of reflecting red light or infrared light. In addition, the LED device may further include a light transmittable dielectric layer 104 which is disposed on and cooperates with the reflective layer 102 to form an omni-directional reflector (ODR), so as to enhance the reflective efficiency. The light transmittable dielectric layer 104, which may be made of silicon oxides (SiOx) or magnesium fluoride ($MgF_2$), is formed with at least one through hole 10, in which an alloy material (such as AuGe, AuNi, AuBe, AuZn, etc.) is filled to form an ohmic contact element 105. To firmly bond the reflective layer 102 and the light transmittable dielectric layer 104, an adhesive layer 103 which is usually made of indium zinc oxide (IZO) or indium tin oxide (ITO) may be interposed between the reflective layer 102 and the light transmittable dielectric layer 104.

However, the reflective layer 102 does not directly contact the ohmic contact element 105, and the adhesive layer 103 may have a resistance greater than that of the ohmic contact element 105 to result in an increase in series resistance, thereby causing the conventional LED device having a relatively high operating voltage.

SUMMARY

Therefore, an object of the disclosure is to provide an LED device and a method for manufacturing an LED device that can alleviate at least one of the drawbacks of the prior art.

According to the disclosure, the LED device includes an epitaxial structure, a light transmittable dielectric element, an adhesive layer, and a metal contact element.

The epitaxial structure includes a first-type semiconductor unit that has a contact surface, an active layer that is disposed on the first-type semiconductor unit opposite to the contact surface, and a second-type semiconductor unit that is disposed on the active layer opposite to the first-type semiconductor unit and that has a light emitting surface opposite to the active layer.

The light transmittable dielectric element is disposed on the contact surface of the first-type semiconductor unit, and is formed with at least one first through hole to expose the contact surface of the first-type semiconductor unit.

The adhesive layer is disposed on a surface of the light transmittable dielectric element opposite to the first-type semiconductor unit, and is formed with at least one second through hole that is in spatial communication with and corresponds in position to the first through hole. The adhesive layer has a thickness that is at most one fifth of a thickness of the light transmittable dielectric element.

The metal contact element is disposed on a surface of the adhesive layer opposite to the light transmittable dielectric element, and extends into the first and second through holes and electrically contacts the contact surface of the first-type semiconductor unit.

According to the disclosure, the method includes steps 1) to 3). Step 1) is to provide an epitaxial structure that includes a first-type semiconductor unit having a contact surface, an active layer disposed on the first-type semiconductor unit opposite to the contact surface, and a second-type semiconductor unit disposed on the active layer opposite to the first-type semiconductor unit and having a light emitting surface opposite to the active layer.

Step 2) is to form a light transmittable dielectric element on the contact surface of the first-type semiconductor unit, and then to form an adhesive layer on a surface of the light transmittable dielectric element opposite to the first-type semiconductor unit. The light transmittable dielectric element is formed with at least one first through hole to expose the contact surface. The adhesive layer is formed with at least one second through hole that is in spatial communication with and corresponds in position to the first through hole, and has a thickness that is at most one fifth of a thickness of the light transmittable dielectric element.

Step 3) is to form a metal contact element on a surface of the adhesive layer opposite to the light transmittable dielectric element. The metal contact element extends into the first and second through holes and electrically contacts the contact surface of the first-type semiconductor unit.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
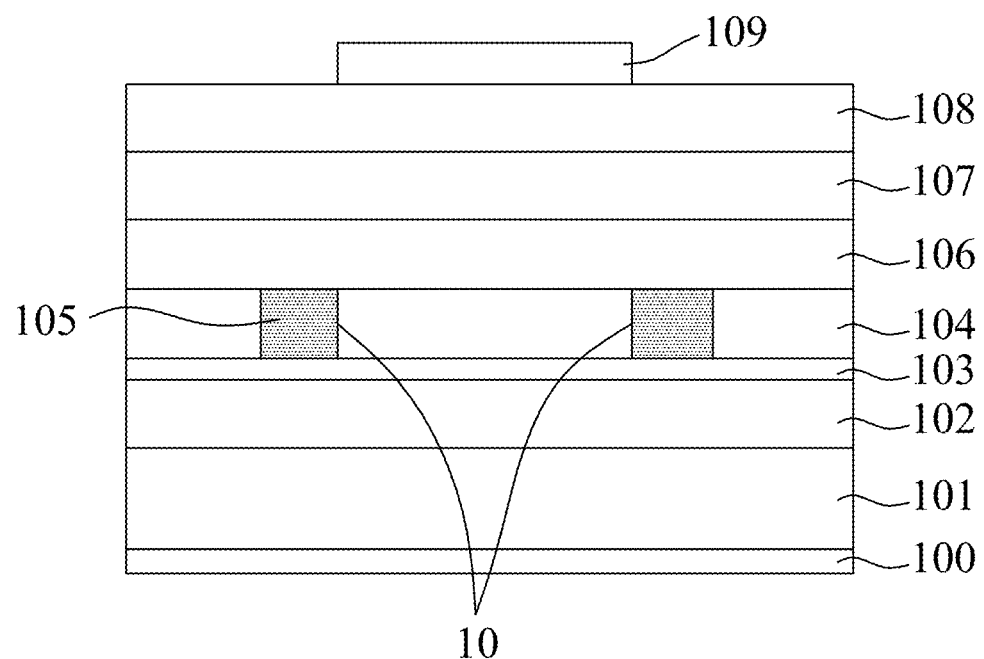
FIG. 1 is a schematic sectional view illustrating a conventional light-emitting diode (LED) device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
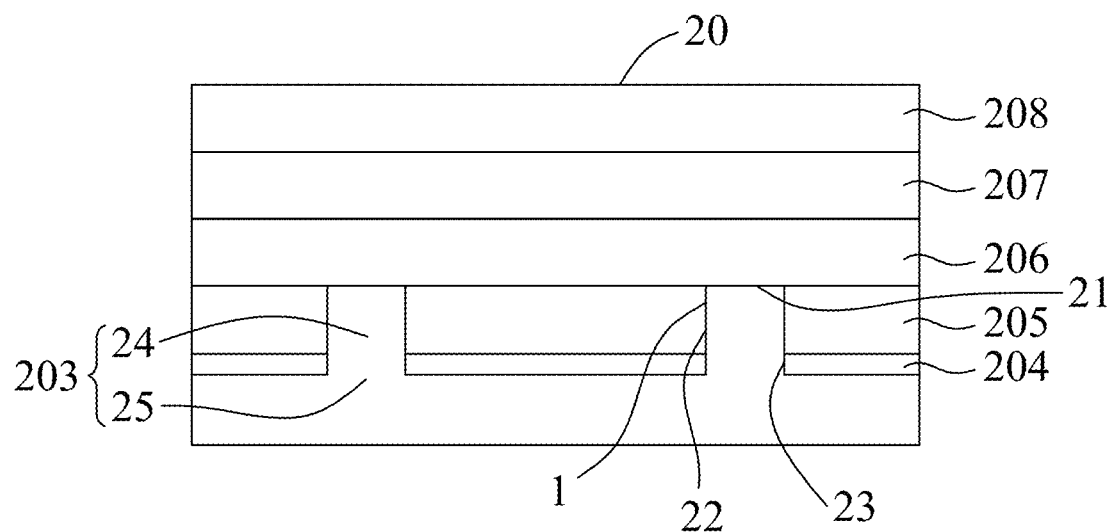
FIG. 2 is a schematic sectional view illustrating a first embodiment of an LED device according to the disclosure.

Referring to FIG. 2, a first embodiment of a light emitting diode (LED) device according to the present disclosure includes an epitaxial structure, a light transmittable dielectric element 205, an adhesive layer 204, and a metal contact element 203.

The epitaxial structure includes a first-type semiconductor unit 206, an active layer 207, and a second-type semiconductor unit 208. The first-type semiconductor unit 206 has a contact surface 21. The active layer 207 is disposed on the first-type semiconductor unit 206 opposite to the contact surface 21. The second-type semiconductor unit 208 is disposed on the active layer 207 opposite to the first-type semiconductor unit 206 and has alight emitting surface 20 opposite to the active layer 207. The light emitting surface 20 of the second-type semiconductor unit 208 may be roughened to enhance the light extraction efficiency.

As used herein, the term "first-type" refers to being doped with a first type dopant, and the term "second-type" refers to being doped with a second type dopant that is opposite in conductivity to the first type dopant. For instance, the first type dopant may be a p-type dopant, and the second type dopant may be an n-type dopant, and vice versa.

In this embodiment, the first-type semiconductor unit 206 is a p-type semiconductor unit, and the second-type semiconductor unit 208 is an n-type semiconductor unit. The p-type semiconductor unit may include a covering layer made of aluminum indium phosphide (AlInP)-based material, and a current spreading layer disposed on the covering layer and made of gallium nitride (GaN)-based material (not shown in the figures). The n-type semiconductor unit may include a covering layer made of aluminum indium phosphide (AlInP)-based material, and a current spreading layer disposed on the covering layer opposite to the active layer 207 and made of aluminum gallium indium nitride (AlGaInN)-based material (not shown in the figures).

The active layer 207 may be one of an intrinsic semiconductor layer, a p-type semiconductor layer and an n-type semiconductor layer, and may be excited by an electrical current passing through the epitaxial structure to emit light. The active layer 207, when made of nitride-based material, is configured to emit blue or green light. The active layer 207, when made of AlGaInN-based material, is configured to emit red, orange or yellow light. The active layer 207, when made of aluminum gallium arsenide (AlGaAs)-based material, is configured to emit infrared light. In this embodiment, the active layer 207 is made of AlGaInN-based material.

The light transmittable dielectric element 205 is disposed on the contact surface 21 of the first-type semiconductor unit 206, and is formed with at least one first through hole 22 to expose the contact surface 21 of the first-type semiconductor unit 206. The light transmittable dielectric element 205 may include at least one layer made of an insulating material having high resistance. Examples of the insulating material may include, but are not limited to, a fluoride compound (such as magnesium fluoride ($MgF_2$)), an oxide compound (such as silicone oxide, zinc oxide), a nitride compound (such as silicon nitride), and combinations thereof.

In addition, the light transmittable dielectric element 205 is capable of reflecting light from the active layer 207 back toward the light emitting surface 20 or a lateral surface of the epitaxial structure to emit light outside the LED device. Therefore, the light transmittable dielectric element 205 may have a refractive index lower than that of the epitaxial structure, so as to increase the amount of light reflected by the light transmittable dielectric element 205. In certain embodiments, the refractive index of the light transmittable dielectric element 205 is not greater than 1.5 (e.g., not greater than 1.4). The light transmittable dielectric element 205 may exhibit a light transmittance of at least 60%, 70%, 80% or 90%.

The light transmittable dielectric element 205 may be a single-layer structure, or may be a multi-layered structure that may be made of the same insulating material or at least two different insulating materials as mentioned above which have different refractive indices. For example, the light transmittable dielectric element 205, when in the form of the multi-layered structure, may include multiple pairs of dielectric layers, each of which including a first dielectric layer and a second dielectric layer that are made of different insulating materials. The first dielectric layers and the second dielectric layers in the light transmittable dielectric element 205 are alternately-stacked.

The light transmittable dielectric element 205 may have a thickness that is equal to or greater than 50 nm (such as 50 nm to 500 nm). In certain embodiments, the light transmittable dielectric element 205 has a thickness ranging from 50 nm to 150 nm (such as 100 nm to 150 nm). The light transmittable dielectric element 205 may have an optical thickness that is equal to an integer multiple of one-quarter of the emitting wavelength (i.e., $\lambda/4$) of the active layer 207.

The light transmittable dielectric element 205 has at least one hole-defining wall 1 that defines the first through hole 22. The hole-defining wall 1 may angularly extend away from the contact surface 21 at an angle that is equal to or greater than 90°, and that is not greater than 180°. The cross section of the hole-defining wall 1 may be in a shape of circle, oval, polygon, etc. In this embodiment, the light transmittable dielectric element 205 is formed with a plurality of the first through holes 22, each of which independently has a width ranging from 2 μm to 10 μm. Each of the hole-defining walls 1 perpendicularly extends from the contact surface 21, i.e., the first through hole 22 has a consistent width along the hole-defining wall 1.

Figure 3:
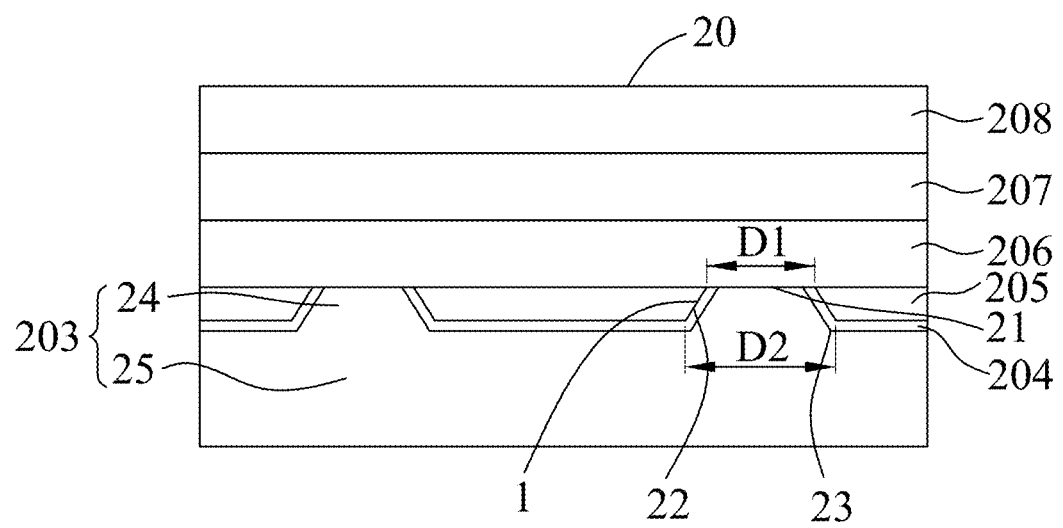
FIG. 3 is a schematic sectional view illustrating a variation of the first embodiment according to the disclosure.

Alternatively, in a variation of the first embodiment, the hole-defining wall 1 of each of the first through holes 22 angularly extends away from the contact surface 21 at an angle ranging from 110° to 170° (see FIG. 3). That is, each of the first through holes 22 has a width that varies in a direction away from the contact surface 21. The first through hole 22 has a first width D1 at a first side adjacent to the contact surface 21 and a second width D2 at a second side opposite to the first side, and the first width is smaller than the second width. In certain embodiments, the first width is a smallest width of the first through hole 22, and the second width D2 is a largest width of the first through hole 22. The difference between the second width D2 and the first width D1 may be at least 1 nm (e.g., 1 nm to 20 nm), or at least 20 nm (e.g., 20 nm to 1000 nm or 20 nm to 100 nm). Alternatively, in other embodiments, each of the first through holes 22 has a width gradually varying in a direction away from the contact surface (i.e., D1 is equal to D2).

The adhesive layer 204 is disposed on a surface of the light transmittable dielectric element 205 opposite to the first-type semiconductor unit 206. The adhesive layer 204 is formed with at least one second through hole 23 that is in spatial communication with and corresponds in position to the first through hole 22. It should be noted that a width of the second through hole 23 is not restricted to that of the first through hole 22. In this embodiments, the width of the second through hole 23 is equal to (or may be greater than) the largest width of the first through hole 22. That is, the second through hole 23 may be configured to expose the hole-defining wall 1 of the light transmittable dielectric element 205 and the contact surface 21.

Alternatively, the width of the second through hole 23 is smaller than the width of the first through hole 23. That is, the adhesive layer 204 extends into the first through hole 22 to cover at least a portion of the hole-defining wall 1 of the light transmittable dielectric element 205 or the entire hole-defining wall 1 so as to contact the contact surface 21 (see FIG. 3), thereby improving the adhesion between the light transmittable dielectric element 205 and the metal contact element 203 to be disposed in the first and second through holes 22, 23. A portion of the adhesive layer 204 formed on the light transmittable dielectric element 205 may have a thickness equal to or greater than that of the adhesive layer 204 formed on the hole-defining wall 1.

The adhesive layer 204, which is required to have a desired adhesion between the light transmittable dielectric element 205 and the metal contact element 203, is made of a transparent electrically conductive material. Examples of the transparent electrically conductive material may include, but are not limited to, indium zinc oxide (IZO), indium tin oxide (ITO), and the combination thereof. The adhesive layer 204 may have a refractive index greater than that of the light transmittable dielectric element 205. In addition, the adhesive layer 204 may exhibit a light transmittance lower than that of the light transmittable dielectric element 205.

In certain embodiments, the adhesive layer 204 has a thickness that is at most one fifth of a thickness of the light transmittable dielectric element. For example, the adhesive layer 204 may have a thickness that is equal to or less than 10 nm, such as 0.1 nm to 10 nm, 1 nm to 5 nm or 5 nm to 10 nm. When the thickness is greater than 10 nm, the light absorption of the adhesive layer 204 becomes a serious problem. When the thickness is lower than 0.1 nm, the adhesive layer 204 exhibits poor adhesion. The adhesive layer 204 may be in a form of continuous layer, or may consist of a plurality of spaced apart discrete regions when the adhesive layer 204 becomes thinner (e.g. having a thickness ranging from 0.5 nm to 2 nm).

The metal contact element 203 is disposed on a surface of the adhesive layer 204 opposite to the light transmittable dielectric element 205, and extends into and fills the first and second through holes 22, 23 and electrically contacts the contact surface 21 of the first-type semiconductor unit 206. The metal contact element 203 may include at least one metal layer. When a plurality of the metal layers are applied, the metal layers are stacked on one another on the surface of the adhesive layer 204 to form the metal contact element 203.

The metal contact element 203 may include an ohmic contact part 24 that is disposed in the first through hole 22 to electrically contact the first-type semiconductor unit 206, and a reflective part 25 that is disposed on the ohmic contact part 24 and that covers the adhesive layer 204. As compared to the conventional LED device shown in FIG. 1, in which the adhesive layer 103 is disposed between the reflective layer 102 and the ohmic contact element 105, and may have a resistance greater than that of the ohmic contact element 105 (causing an increase in series resistance), the LED device of this disclosure can be operated under a relatively low operating voltage at least for the reason that the reflective part 25 is disposed on and directly electrically contact the ohmic contact part 24 adjacent to the first through hole 22 of the light transmittable dielectric element 205, and that the adhesive layer 204 disposed between the reflective part 25 and the light transmittable dielectric element 205 may avoid an increase in series resistance.

The ohmic contact part 24 of the metal contact element 203 may be made of an alloy material, such as AuZn, AuGe, AuGeNi, AuBe, AuNi, etc. The reflective part 25 may be made of a reflective metal material, such as gold, silver, and the combination thereof. The reflective part 25 may have a reflectance not less than that of the ohmic contact part 24.

Figure 13:
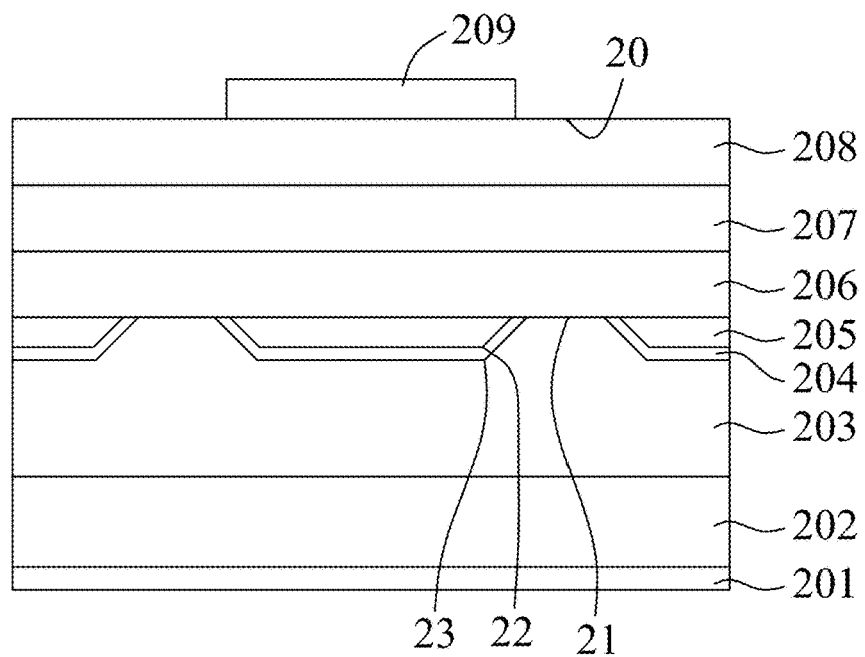

The LED device of this disclosure may further include a first electrode 201 that is disposed on and electrically connects to the metal contact element 203 (e.g., through a bonding substrate 202 with electrical conductivity), and a second electrode 209 that is disposed on and electrically connects to the second-type semiconductor unit 208 (see FIG. 13). The first and second electrodes 201, 209 may be connected to an external electrical component (not shown in the figures) for providing the LED device with a current to emit light.

In certain embodiments, the LED device may further include a bonding layer (not shown in the figures) that is disposed between the reflective part 25 and the bonding substrate 202 to bond the epitaxial structure to the bonding substrate 202. The bonding layer may be Au—Au bonding layer, Au—In bonding layer, etc.

In addition, the LED device may further include a blocking layer (not shown in the figures) disposed between the bonding layer and the reflective part 25 to prevent the metal(s) (such as silver) of the ohmic contact part 24 and/or of the reflective part 25 from diffusing toward the bonding layer. The blocking layer may be made of Au, Ti, Pt, Cr, and combinations thereof. The blocking layer may be a laminated structure containing a Ti sublayer and a Pt sublayer.

For obtaining an improved ohmic contact between the second electrode 209 and the second-type semiconductor unit 208, the second-type semiconductor unit 208 may further include an ohmic contact layer (such as n-type ohmic contact layer made of gallium arsenide-based material) disposed on the window layer opposite to the active layer 207, and the second electrode 209 is disposed on the ohmic contact layer.

In the first embodiment, the light transmittable dielectric element 205 is made of $MgF_2$, and has a thickness ranging from 100 nm to 150 nm, a relatively low refractive index of 1.38 and a relatively high thermal conductivity ranging from 14 W/mK to 15 W/mK. The adhesive layer 204 is made of IZO by a sputtering process, and has a thickness ranging from 0.1 nm to 10 nm. The metal contact element 203 includes the ohmic contact part 24 that is made of AuZn, the reflective part 25 that is made of Au or mainly made of Au (e.g., may have a certain content of Zn from the ohmic contact part 24 due to diffusion phenomena). In addition to the alloy material of the ohmic contact part 24, the light transmittable dielectric element 205 and the reflective part 25 cooperatively form an omni-directional reflector (ODR), which may greatly improve the light output (LOP) of the LED device.

Alternatively, in certain embodiments, the light transmittable dielectric element 205 is made of silicon oxide, and the adhesive layer 204 is made of IZO and has a thickness ranging from 0.1 nm to 10 nm.

Referring to FIGS. 4 to 13, a method for manufacturing the first embodiment of the LED device and the variation thereof includes steps S1 to S5 described below.

Figure 4:
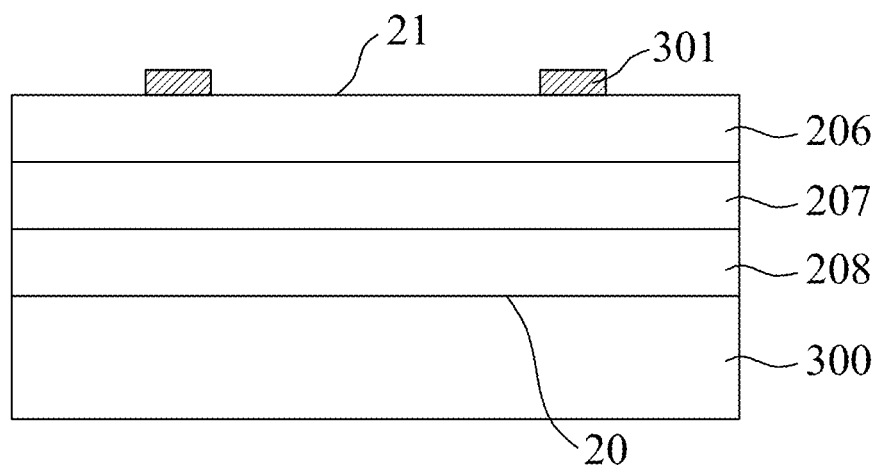
FIGS. 4 to 13 are schematic sectional views illustrating the steps of a method for manufacturing the first embodiment of the LED device and the variation thereof.

In step S1, referring to FIG. 4, the epitaxial structure is provided, e.g., on a temporary substrate 300. The temporary substrate 300 may be made of a material, such as sapphire, GaAs-based material, GaN-based material, etc. The epitaxial structure includes the second-type semiconductor unit 208, the active layer 207, and the first-type semiconductor unit 206 sequentially disposed on the temporary substrate 300 in such order. The light emitting surface 20 of the second-type semiconductor unit 208 is adjacent to and faces the temporary substrate 300, and the contact surface 21 of the first-type semiconductor unit 206 is distal from the temporary substrate 300.

Figure 7:
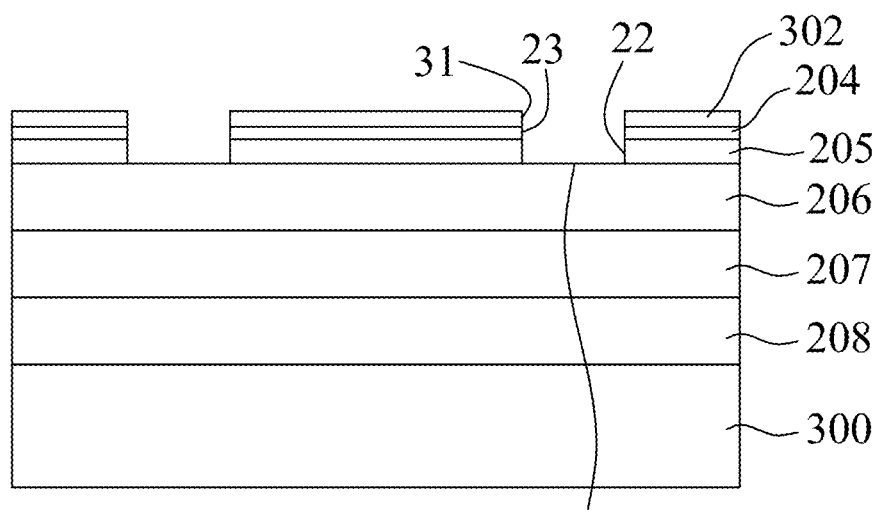
Figure 10:
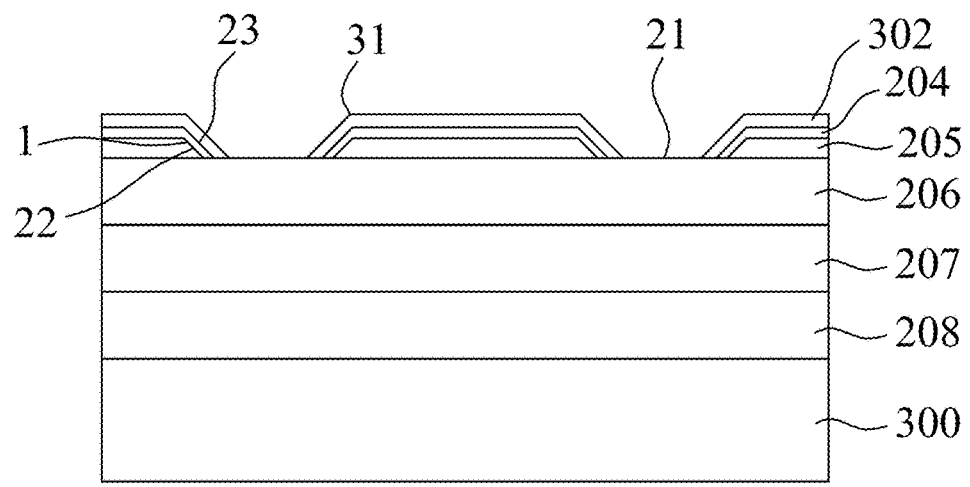

In step S2, referring to FIGS. 7 and 10, the light transmittable dielectric element 205 is formed on the contact surface 21 of the first-type semiconductor unit 206, and then the adhesive layer 204 is formed on the surface of the light transmittable dielectric element 205 opposite to the first-type semiconductor unit 206. The light transmittable dielectric element 205 is formed with at least one first through hole 22 to expose the contact surface 21. The adhesive layer 204 is formed with at least one second through hole 23 that is in spatial communication with and corresponds in position to the first through hole 22.

To be specific, referring to FIGS. 4 to 7, step S2 of the method for manufacturing the first embodiment of the LED device includes substeps S21, S22 and S23.

In substep S21, referring to FIG. 4, at least one sacrificial unit 301 is disposed on the contact surface 21. The sacrificial unit 301 may include at least one sacrificial layer. That is, the sacrificial unit 301 may be a single-layer structure or a multi-layered structure. The sacrificial layer may be at least one of a metal layer, a dielectric layer and a photoresist layer. The metal layer may be made of Ti or TiW. The dielectric layer may be made of silicon oxide or silicon nitride. In this embodiment, a plurality of the sacrificial units 301 are spaced apart disposed on the contact surface 21, and each of the sacrificial unit 301 is a single-layer structure, namely the metal layer. The sacrificial units 301 cooperatively form a patterned sacrificial film, which may be formed by a photolithography process.

Figure 5:
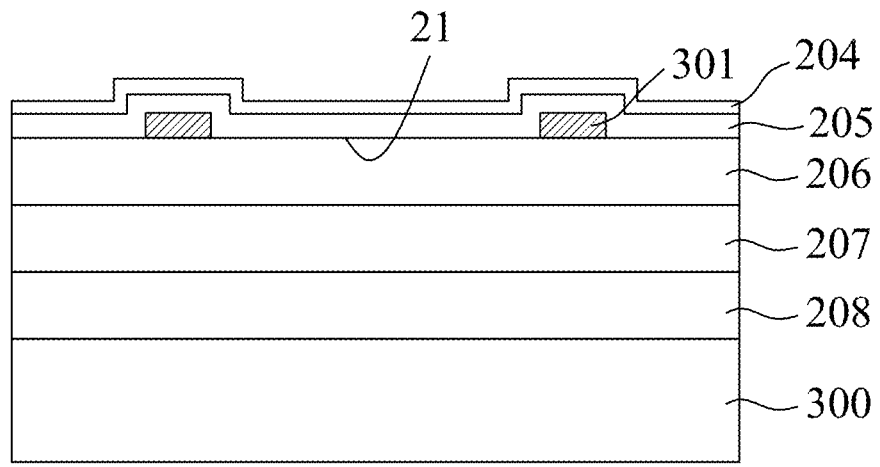
Figure 6:
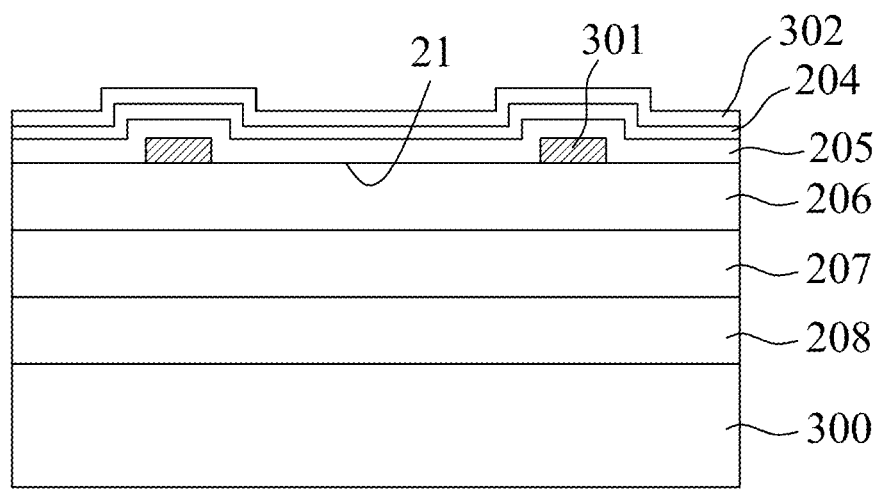

In substep S22, referring to FIG. 5, the light transmittable dielectric element 205 is formed on the contact surface 21 of the first-type semiconductor unit 206 and the sacrificial unit 301 via, e.g., a vapor deposition process, and then the adhesive layer 204 is formed on the light transmittable dielectric element 205 via, e.g., a sputtering process. The light transmittable dielectric element 205 may be made of $MgF_2$ or silicon oxide, and may have a thickness ranging from 50 nm to 500 nm. The adhesive layer 204 may be made of IZO, and may have a thickness of not greater than 10 nm (such as 0.1 nm to 10 nm).

Since IZO has a relatively high reactivity, the adhesive layer 204 is prone to be easily removed together with the sacrificial unit 301 in a subsequent removal process (such as etching process), particularly when the adhesive layer 204 has a thinner thickness. Therefore, referring to FIG. 6, in certain embodiments, a metallic protective layer 302 is further formed on the adhesive layer 204, so as to protect the adhesive layer 204 during the subsequent removal process. The metallic protective layer 302 may be made of noble metals, such as Au or Ag. The metallic protective layer 302 may be a reflective layer serving as a part of the metal contact element 203 to reflect light from the active layer 207.

In substep S23, referring to FIG. 7, the sacrificial unit 301 is removed via, e.g., wet etching, and meanwhile, a portion of the adhesive layer 204 and a portion of the light transmittable dielectric element 205 that are formed on and correspond in position to the sacrificial unit 301 are also removed, so as to form the first through hole 22 in the light transmittable dielectric element 205 and the second through hole 23 in the adhesive layer 204. If present, the metallic protective layer 302, which is formed on and corresponds in position to the sacrificial unit 301, is also removed along with the sacrificial unit 301, the portion of the adhesive layer 204 and the portion of the light transmittable dielectric element 205, so as to form at least one third through hole 31 in the metallic protective layer 302 which corresponds in position and number to the second through hole 23.

In certain embodiments, the substep S23 is conducted using an etching solution which selectively etches the sacrificial unit 301, and does not etch the adhesive layer 204 and the light transmittable dielectric element 205 formed on the first-type semiconductor unit 206.

Figure 8:
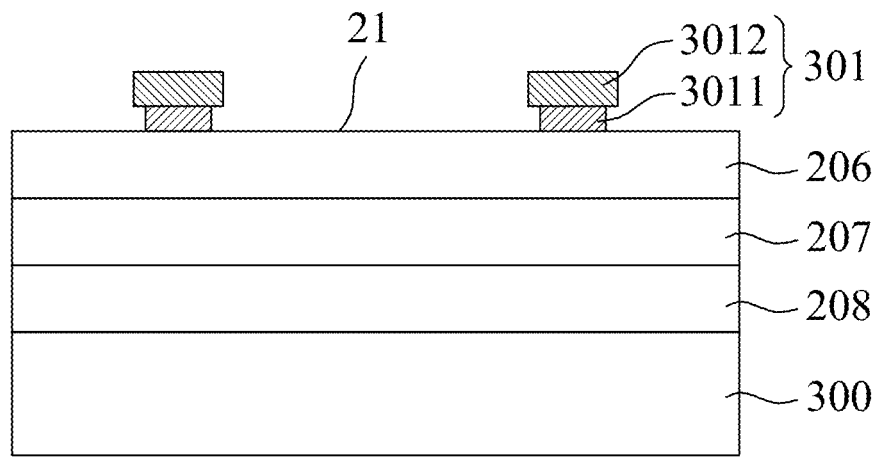
Figure 9:
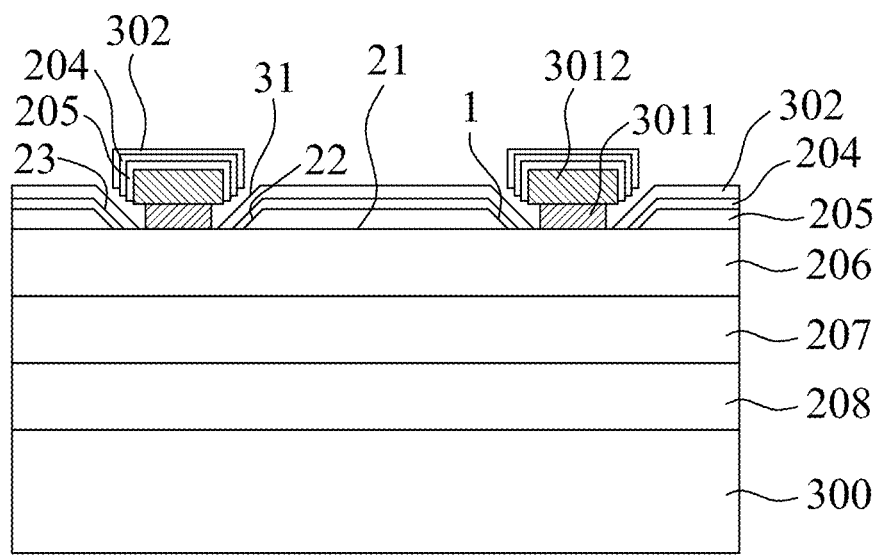

Referring to FIGS. 8 to 10, substeps S21, S22 and S23 of the method for manufacturing the variation of the first embodiment of the LED device (see FIG. 3) are similar to those for manufacturing the first embodiment, except for the following differences.

As shown in FIG. 8, the sacrificial unit 301 formed in substep S21 includes a first sacrificial element 3011 and a second sacrificial element 3012 that is disposed on the first sacrificial element 3011. The first sacrificial element 3011 has a diameter smaller than that of the second sacrificial element 3012. The first and second sacrificial elements 3011, 3012 may be made of an etchable material, such as silicon oxide, silicon nitride, etc.

The first and second sacrificial elements 3011, 3012 may be prepared as follows. First and second sacrificial layers that are made of etchable materials having different etching rates are sequentially formed on the first-type semiconductor unit 206 via a deposition process. Then, the first and second sacrificial layers are subjected to an etching process using an etching solution, so as to obtain the first sacrificial element 3011 and the the second sacrificial element 3012 which has a diameter larger than that of the first sacrificial element 3011. The etching solution is used to etch the material of the first sacrificial element 3011 at a first etching rate and etch the material of the second sacrificial element 3012 at a second etching rate, the first etching rate being higher than the second etching rate.

For example, the first sacrificial layer made of silicon oxide is formed on the first-type semiconductor unit 206, and then the second sacrificial layer made of silicon oxide is formed on the first sacrificial element 3011 under a temperature higher than that for the first sacrificial layer, such that the compactness of the second sacrificial layer is greater than the first sacrificial layer (i.e., the etching rate of the second sacrificial layer is higher). Next, the second sacrificial layer is covered with a photomask, and then the first and second sacrificial layers are etched with a buffered oxide etch (BOE) solution, so as to obtain the first sacrificial element 3011 having a diameter smaller than that of the second sacrificial element 3012.

Referring to FIG. 9, in substep S22, since the second sacrificial element 3012 has a diameter greater than that of the first sacrificial element 3011, the light transmittable dielectric element 205, which is in a form of a discontinuous layer, covers a top surface and a lateral surface of the second sacrificial element 3012 and the contact surface 21 exposed from the sacrificial unit 301, and does not cover a lateral surface of the first sacrificial element 3011. The light transmittable dielectric element 205 has an inclined surface extending away from the contact surface 21 (i.e., corresponding to the hole-defining wall 1), and is formed with a gap defined between the first sacrificial element 3011 and the inclined surface of the light transmittable dielectric element 205 (i.e., corresponding in position to the first through hole 22 defined by the hole-defining wall 1 that is to be formed by the subsequent substep S23).

Afterward, the adhesive layer 204 and the metallic protective layer 302 (if present) are formed as a discontinuous layer in a shape similar to the light transmittable dielectric element 205. That is, the adhesive layer 204 covers the light transmittable dielectric element 205, and has an inclined surface extending away from the contact surface 21 and is formed with a gap that is defined between the first sacrificial element 3011 and the inclined surface of the adhesive layer 204 and that corresponds in position to the second through hole 23 to be formed in the subsequent substep S23. The metallic protective layer 302 covers the adhesive layer 204, and has an inclined surface extending away from the contact surface 21 and is formed with a gap that is defined between the first sacrificial element 3011 and the inclined surface of the metallic protective layer 302 and that corresponds in position to the third through hole 31 to be formed in the subsequent substep S23.

Referring to FIG. 10, in substep S23, the sacrificial unit 301 is removed, and a portion of the adhesive layer 204, a portion of the light transmittable dielectric element 205 and a portion of the metallic protective layer 302 that are formed on and correspond in position to the sacrificial unit 301 are also removed. Since the the adhesive layer 204 extends into the first through hole 22 along the hole-defining wall 1, the area for adhesion between the light transmittable dielectric element 205 and the metal contact element 23 to be disposed thereon can be increased, thereby improving the reliability of the LED device of this disclosure.

Figure 17:
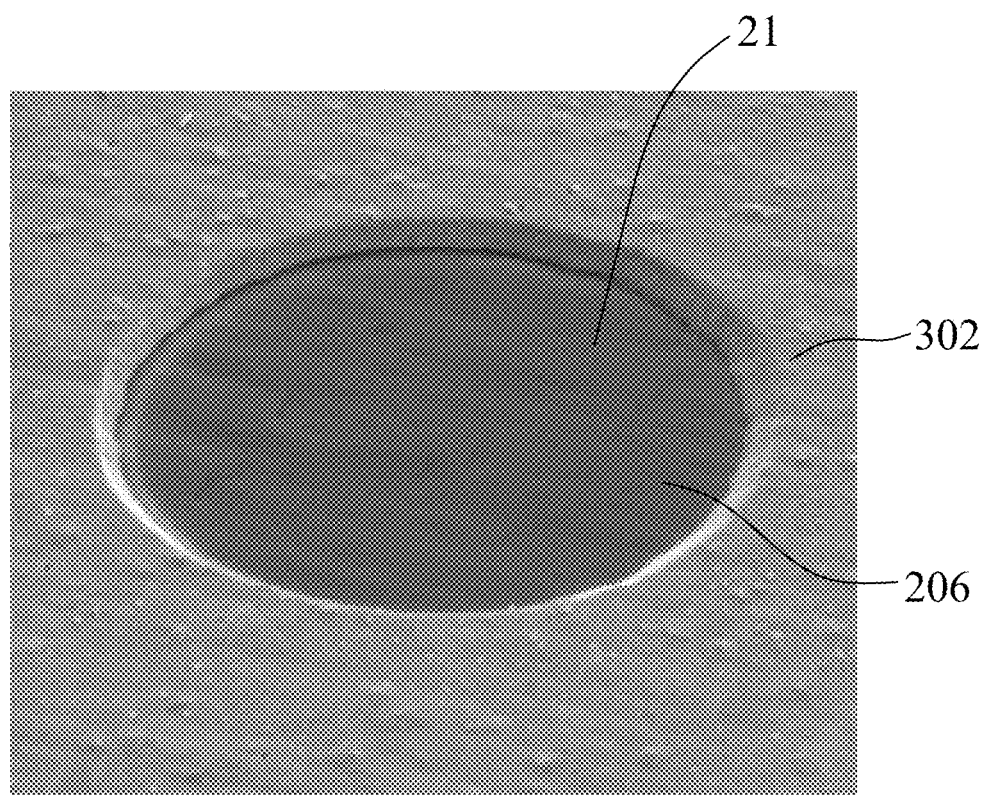
FIG. 17 is a transmission electron microscope (TEM) photograph showing a top view of a semi-product obtained after step S2 of the method for manufacturing the variation of the first embodiment of the LED device.

The thus obtained semi-product from step S2 has a structural configuration shown in FIG. 17, which was observed using transmission electron microscope (TEM). It can be seen in FIG. 17 that the metallic protective layer 302 is a topmost layer and an opening (corresponding in position to the first, second and third through holes) is formed to expose the contact surface 21 of the first-type semiconductor unit 206. The opening is defined by an inclined surface, which is covered by the metallic protective layer 302.

Figure 11:
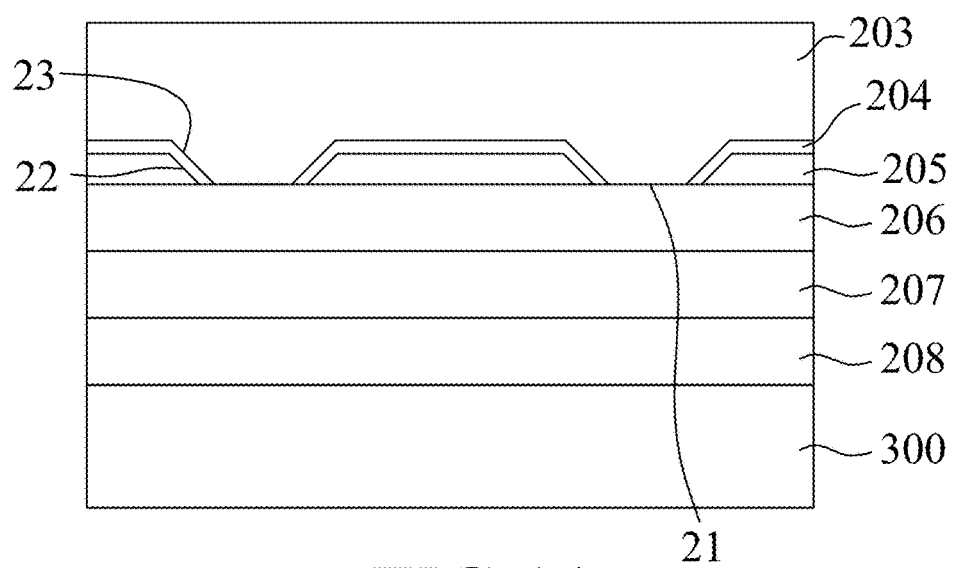

In step S3, referring to FIG. 11, the metal contact element 203 is formed on a surface of the adhesive layer 204 opposite to the light transmittable dielectric element 205. The metal contact element 203 extends into the first and second through holes 22, 23 and electrically contacts the contact surface 21 of the first-type semiconductor unit 206.

To be specific, an ohmic contact layer, which may be made of AuZn, AuGe, AuNi, AuBe, AuNi, etc., and a reflective layer, which may be made of the same material as the metallic protective layer 302, are subsequently formed on the metallic protective layer 302 and fills the first and second through holes 22, 23.

Alternatively, the ohmic contact layer and the reflective layer are directly formed on the metallic protective layer 302. Thereafter, the ohmic contact layer, the reflective layer and the metallic protective layer 302 are subjected to a heating treatment, such that the diffusible metal present in the ohmic contact layer (such as Zn, Ge, AuNi, Be, Ni, etc.) is diffused to be proximate to the contact surface 21 to form ohmic contact (i.e., the ohmic contact part 24). The metallic protective layer 302 and the reflective layer made of the same metal material cooperatively form a part of the metal contact element 203 (i.e., the reflective part 25). That is, the metallic protective layer 302 can function as the reflective part 25 to reflect light from the light transmittable dielectric element 205.

Figure 12:
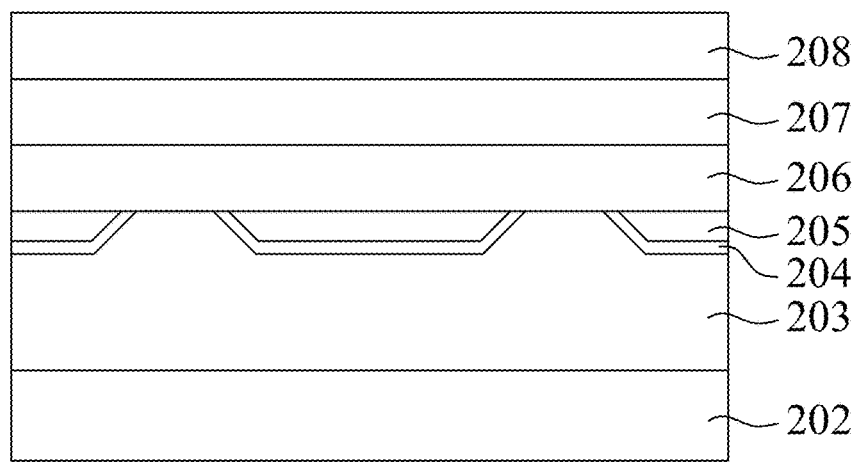

In step S4, referring to FIG. 12, the temporary substrate 300 is removed from the second-type semiconductor unit 208, and the bonding substrate 202 is disposed on the the metal contact element 203 opposite to the adhesive layer 204. The bonding substrate may be made of silicon, silicon carbide, metal, alloy, etc.

Figure 14:
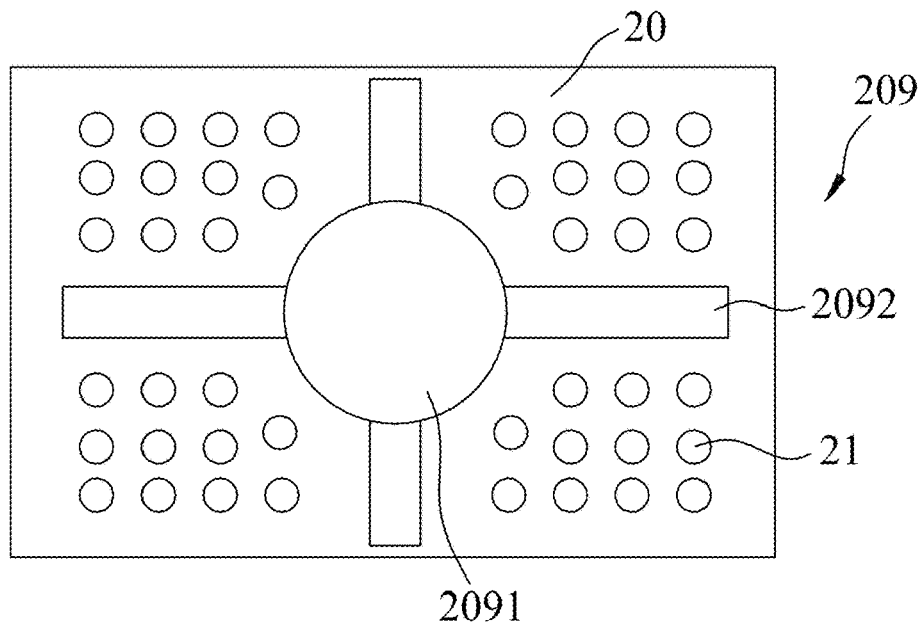
FIG. 14 is a schematic top view illustrating a second electrode of the first embodiment of the LED device.

In step S5, referring to FIG. 13, the first electrode 201 is disposed on the bonding substrate 22 opposite to the metal contact element 203 and electrically connects to the metal contact element 203, and the second electrode 209 is disposed on the light emitting surface 20 and electrically connects to the second-type semiconductor unit 208. Referring to FIG. 14, the second electrode 209 includes a contact electrode 2092 and an electrode pad 2091 disposed on the contact electrode 2092. The contact electrode 2092 may include a central part corresponding in position to the electrode pad 2091, and a plurality of spaced apart electrode extensions extending from the central part along the light emitting surface 20.

Figure 15:
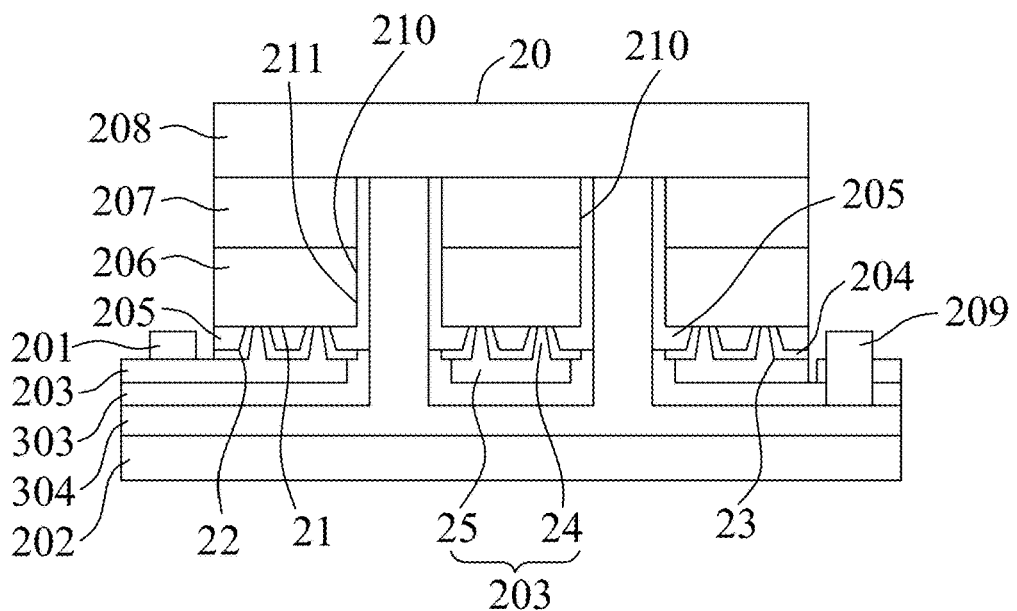
FIG. 15 is a schematic sectional view illustrating a second embodiment of the LED device according to the disclosure.

Referring to FIG. 15, a second embodiment of the LED device according to the present disclosure is generally similar to the variation of the first embodiment, except for the following differences.

To be specific, in the second embodiment, the epitaxial structure is formed with at least one recess 210 which is defined by a recess-defining surface 211 extending from the first-type semiconductor unit 206 to the second-type semiconductor unit 208. The recess 210 may have a width of at least 1 μm, and may have a cross-sectional area ranging from 1% to 20% based on a total area of the contact surface 21.

The light transmittable dielectric element 205 and the adhesive layer 204 are disposed at least on the contact surface 21. The light transmittable dielectric element 205 may further extends into the recess 210 along the recess-defining surface 211 to cover the recess-defining surface 211, and a surface of the second-type semiconductor unit 208 opposite to the light emitting surface 20 is exposed therefrom.

The metal contact element 203 includes the ohmic contact part 24 that extends into the first and second through holes 22, 23 and electrically contacts the contact surface 21, and the reflective part 25 that is disposed on the ohmic contact part 24 and covers the adhesive layer 204. The metal contact element 203 may further include the metal blocking layer disposed on the reflective part 25 (not shown in the figures).

In addition, the second embodiment of the LED device may further include an insulating layer 303 disposed on metal contact element 203. The insulating layer 303 may be made of silicon oxide, silicon nitride or a fluoride compound.

The second embodiment may further include a metal covering film 304 that is disposed on the insulating layer 303, extends into and fills the recess 210, and electrically contacts the second-type semiconductor unit 208. The bonding substrate 202 may be made of a non-conductive material or an electrically conductive material. In certain embodiments, the bonding layer (not shown in the figures) may be further interposed between the bonding substrate 202 and the metal covering film 304 to bond therebetween. The metal contact element 203 may be configured to prevent the metal(s) (such as silver) of the reflective part 25 from diffusing toward the the the bonding layer.

The first electrode 201 is disposed on a surface of the metal contact element 203 opposite to the insulating layer 303. The second electrode 209 is disposed on a surface of the metal covering film 304 opposite to the bonding substrate 202. The first and second electrodes 201, 209 are located at the same side of the epitaxial structure opposite to the light emitting surface 20 for electrically connecting to an external electrical component (not shown in the figures).

Figure 16:
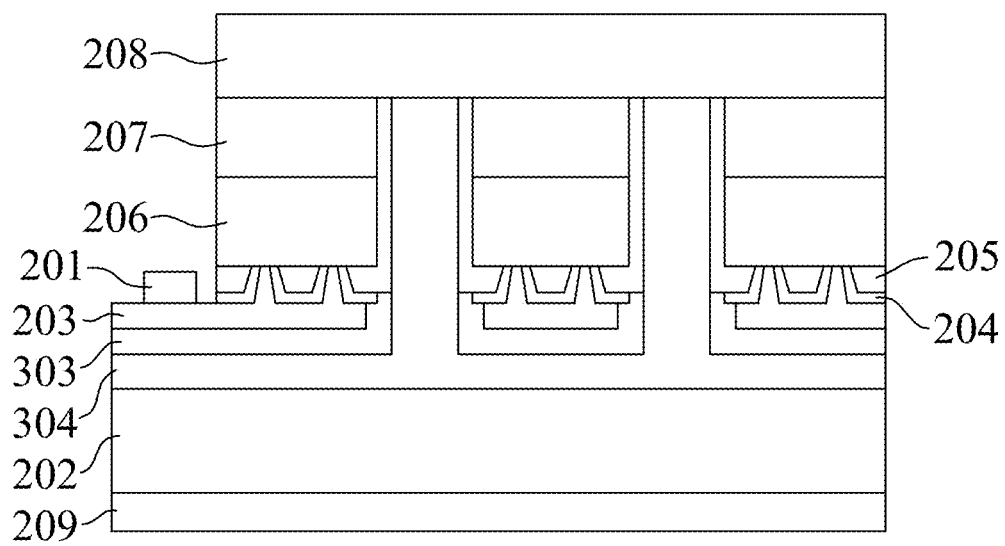
FIG. 16 is a schematic sectional view illustrating a third embodiment of the LED device according to the disclosure.

Referring to FIG. 16, a third embodiment of the LED device according to the present disclosure is generally similar to the second embodiment, except that the bonding substrate 202 is made of an electrically conductive material, and the second electrode 209 is disposed on a surface of the bonding substrate 202 opposite to the metal covering film 304.

In summary, by virtue of the adhesive layer 204 formed with the second through hole(s) 23 that is in spatial communication with and corresponds in position to the first through hole(s) 22 of the light transmittable dielectric element 25, the metal contact element 23, which is disposed on the adhesive layer 204, can further extend into the first and second through holes 22, 23 and electrically contact the contact surface 21 of the first-type semiconductor unit 206, such that the LED device of this disclosure can be operated under a relatively low operating voltage as compared to the conventional device as shown in FIG. 1. In addition, by controlling the thickness of the adhesive layer 204 to be at most one fifth of the thickness of the light transmittable dielectric element 205, the light absorption of the adhesive layer 204 may be greatly reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting diode (LED) device, comprising:
an epitaxial structure including a first-type semiconductor unit having a contact surface, an active layer disposed on said first-type semiconductor unit opposite to said contact surface, and a second-type semiconductor unit disposed on said active layer opposite to said first-type semiconductor unit, said second-type semiconductor unit having a light emitting surface opposite to said first-type semiconductor unit;
a light transmittable dielectric element disposed on said contact surface of said first-type semiconductor unit and formed with at least one first through hole to expose said contact surface;
an adhesive layer disposed on a surface of said light transmittable dielectric element opposite to said first-type semiconductor unit and formed with at least one second through hole disposed in spatial communication with and corresponding positionally to said first through hole, said adhesive layer having a thickness that is at most one fifth of a thickness of said light transmittable dielectric element, and being made of a transparent electrically conductive material; and
a metal contact element disposed on a surface of said adhesive layer opposite to said light transmittable dielectric element, wherein said metal contact element extends into said first and second through holes and electrically contacts said contact surface of said first-type semiconductor unit, wherein said light transmittable dielectric element has at least one hole-defining wall defining said first through hole, wherein said adhesive layer extends into said hole-defining wall, and wherein a width of said second through hole is smaller than a width of said first through hole.

2. The LED device of claim 1, wherein said thickness of said adhesive layer ranges between 0.1 nm to 10 nm.

3. The LED device of claim 1, wherein said thickness of said light transmittable dielectric element is equal to or greater than 50 nm.

4. The LED device of claim 1, wherein said transparent electrically conductive material is selected from the group consisting of indium zinc oxide, indium tin oxide, and the combination thereof.

5. The LED device of claim 1, wherein said light transmittable dielectric element includes at least one layer made of an insulating material.

6. The LED device of claim 5, wherein said insulating material is selected from the group consisting of a fluoride compound, an oxide compound, a nitride compound, and combinations thereof.

7. The LED device of claim 1, wherein said at least one hole-defining wall of said light transmittable dielectric element angularly extends from said contact surface to said adhesive layer.

8. The LED device of claim 7, wherein said at least one hole-defining wall angularly extends from said contact surface to said adhesive layer at an angle that is equal to or greater than 90°, and that is not greater than 180°.

9. The LED device of claim 8, wherein said at least one hole-defining wall angularly extends from said contact surface to said adhesive layer at an angle ranging from 110° to 170°.

10. The LED device of claim 7, wherein said first through hole has a width gradually varying from said contact surface to said adhesive layer, a difference between a largest width and a smallest width of said first through hole being at least 1 nm.

11. The LED device of claim 7, wherein said first through hole has a width gradually varying from said contact surface to said adhesive layer, a difference between a largest width and a smallest width of said first through hole being at least 20 nm.

12. The LED device of claim 1, wherein said metal contact element includes an ohmic contact part disposed in said first through hole to electrically contact said first-type semiconductor unit.

13. The LED device of claim 12, wherein said metal contact element further includes a reflective part disposed on said ohmic contact part and covering said adhesive layer.

14. The LED device of claim 12, wherein said ohmic contact part is made of an alloy material selected from the group consisting of AuZn, AuGe, AuGeNi, AuBe, and AuNi.

15. The LED device of claim 13, wherein said reflective part is made of a metal material selected from the group consisting of gold, silver, and the combination thereof.

16. The LED device of claim 1, wherein said epitaxial structure is configured to emit one of red light and infrared light.

17. The LED device of claim 1, further comprising a first electrode that is disposed on and electrically connects to said metal contact element, and a second electrode that is disposed on and electrically connects to said second-type semiconductor unit.

18. The LED device of claim 1, wherein said epitaxial structure is formed with at least one recess which is defined by a recess-defining surface extending from said first-type semiconductor unit to said second-type semiconductor unit.

19. A method for manufacturing an LED device, comprising the steps of:
  1) Providing an epitaxial structure that includes a first-type semiconductor unit having a contact surface, an active layer disposed on the first-type semiconductor unit opposite to the contact surface, and a second-type semiconductor unit disposed on the active layer opposite to the first-type semiconductor unit and having a light emitting surface opposite to the first-type semiconductor unit;
  2) Forming a light transmittable dielectric element on the contact surface of the first-type semiconductor unit, the light transmittable dielectric element being formed with at least one first through hole to expose the contact surface, and subsequently forming an adhesive layer on a surface of the light transmittable dielectric element opposite to the first-type semiconductor unit, the adhesive layer being formed with at least one second through hole that is in spatial communication with and corresponds in position to the first through hole, and having a thickness that is at most one fifth of a thickness of the light transmittable dielectric element, the adhesive layer being made of a transparent electrically conductive material;
  3) Forming a metal contact element on a surface of the adhesive layer opposite to the light transmittable dielectric element, the metal contact element extending into the first and second through holes and electrically contacting the contact surface of the first-type semiconductor unit.

20. The method of claim 19, wherein step 2) includes the substeps of:
  2a) disposing at least one sacrificial unit on said contact surface;
  2b) forming the light transmittable dielectric element on the contact surface and the sacrificial unit;
  2c) forming the adhesive layer on the light transmittable dielectric element;
  2d) removing the sacrificial unit and a portion of the adhesive layer and a portion of the light transmittable dielectric element that are formed on and correspond in position to the sacrificial unit, so as to form the first through hole in the light transmittable dielectric element and the second through hole in the adhesive layer.

21. The method of claim 20, wherein the sacrificial unit includes at least one sacrificial layer selected from the group consisting of a metal layer, a dielectric layer, and a photoresist layer.

22. The method of claim 20, wherein the sacrificial unit includes a first sacrificial element and a second sacrificial element that is disposed on the first sacrificial element, the first sacrificial element having a diameter smaller than that of the second sacrificial element.

23. The method of claim 20, wherein step 2) further includes, between substeps 2c) and 2d), a substep 2e) of forming a metallic protective layer on the adhesive layer.

24. The method of claim 23, wherein the metallic protective layer is a reflective layer serving as a part of the metal contact element.

25. A light-emitting diode (LED) device, comprising:
  an epitaxial structure including a first-type semiconductor unit having a contact surface, an active layer disposed on said first-type semiconductor unit opposite to said contact surface, and a second-type semiconductor unit disposed on said active layer opposite to said first-type semiconductor unit, said second-type semiconductor unit having a light emitting surface opposite to said first-type semiconductor unit;
  a light transmittable dielectric element disposed on said contact surface of said first-type semiconductor unit and formed with at least one first through hole to expose said contact surface;
  an adhesive layer disposed on a surface of said light transmittable dielectric element opposite to said first-type semiconductor unit and formed with at least one second through hole disposed in spatial communication with and corresponding positionally to said first through hole, said adhesive layer having a thickness that is at most one fifth of a thickness of said light transmittable dielectric element; and
  a metal contact element disposed on a surface of said adhesive layer opposite to said light transmittable dielectric element, wherein said metal contact element extends into said first and second through holes and electrically contacts said contact surface of said first-type semiconductor unit, wherein said light transmittable dielectric element has at least one hole-defining wall defining said first through hole, wherein said adhesive layer extends into said hole-defining wall, wherein a width of said second through hole is smaller than a width of said first through hole, and wherein said at least one hole-defining wall of said light transmittable dielectric element angularly extends from said contact surface to said adhesive layer.

* * * * *